(12) United States Patent
Saito et al.

(10) Patent No.: US 6,787,811 B2
(45) Date of Patent: Sep. 7, 2004

(54) WIRE CONNECTION STRUCTURE AND METHOD OF MANUFACTURING THE SAME

(75) Inventors: Yasuyuki Saito, Kanagawa (JP); Satoko Omizu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/191,565

(22) Filed: Jul. 10, 2002

(65) Prior Publication Data

US 2003/0045016 A1 Mar. 6, 2003

(30) Foreign Application Priority Data

Jul. 10, 2001 (JP) ........................................ 2001-209257
Jul. 2, 2002 (JP) ........................................ 2002-193563

(51) Int. Cl.[7] .............................................. H01L 27/15
(52) U.S. Cl. ........................................ 257/84; 257/776
(58) Field of Search .................................. 257/84, 776

(56) References Cited

U.S. PATENT DOCUMENTS 6,197,418 B1 * 3/2001 Cloots et al. ............... 428/332
6,621,104 B1 * 9/2003 Speckbacher et al. ........ 257/80

FOREIGN PATENT DOCUMENTS

JP 2000-243558 9/2000

* cited by examiner

Primary Examiner—Chandra Chaudhari
Assistant Examiner—David S. Blum
(74) Attorney, Agent, or Firm—Fitzpatrick, Cella, Harper & Scinto

(57) ABSTRACT

A wire connection structure has light-emitting points formed by third electrodes and second electrodes, each second electrode being electrically connected to a first electrode functioning as a lead-out electrode by way of an electro-conductive member, and comprises electro-conductive members for respectively connecting the second electrodes and the first electrodes. The electro-conductive members are formed either by an ink-jet method or a gas deposition method. Thus, an electro-conductive member directly contacts with an end of each of the first electrodes to establish an excellent electric connection between the first electrode and the corresponding second electrode without using an insulating member.

9 Claims, 9 Drawing Sheets

WIRE CONNECTION STRUCTURE AND METHOD OF MANUFACTURING THE SAME

BACKGROUND OF THE INVENTION

1. Field of the Invention

This invention relates to a wire connection structure and a method of manufacturing the same. More particularly, the present invention relates to a wire connection structure having a characteric feature at the lead-out sections arranged outside the effective display region of a display and a method of manufacturing such a structure.

2. Related Background Art

Light-emitting displays comprising organic EL elements and having a simple matrix structure are known. Japanese Patent Application No. 2000-243558 discloses such a display.

FIG. 16A of the accompanying drawings schematically illustrates a light-emitting display as disclosed in the above identified patent document. Referring to FIG. 16A, there are shown transparent electrodes (anodes) 705, a glass substrate 703, a light-emitting layer 707, a sealing box bonding region 714, metal electrodes (cathodes) 709, lead-out/connecting sections 713 and cathode lead-out sections 711.

FIG. 16B illustrates how each metal electrode 709 is connected to a cathode lead-out section 711. In FIG. 16B, reference symbol 716 denotes a high melting point metal layer while reference symbols 715 and 719 respectively denote an ITO layer and an insulating member.

The display of the above identified patent document requires a step of arranging insulating members 719. Furthermore, a metal electrode 709 is arranged on each insulating member 719 so that it can be connected to a corresponding cathode lead-out section 711 only on the top surface of the high melting point metal layer 716.

Thus, the top surface of each cathode lead-out section 711 has to be dedicated to connection with an metal electrode 709.

SUMMARY OF THE INVENTION

According to the invention, the above problem is dissolved by providing a wire connection structure comprising a third electrode and a second electrode forming a light-emitting point, the second electrode being electrically connected to a first electrode functioning as a lead-out electrode by way of an electro-conductive member, the electro-conductive member being formed either by an ink-jet method or a gas deposition method.

In another aspect of the invention, there is provided a wire connection structure comprising a third electrode and a second electrode forming a light-emitting point, the second electrode being electrically connected to a first electrode forming a light-emitting point by way of an electro-conductive member, the first electrode having at least top and front sides covered by the electro-conductive member at an end thereof.

In still another aspect of the invention, there is provided a method of manufacturing a wire connection structure comprising a step of forming a first electrode, a step of forming a second electrode, a step of forming a third electrode so as to form a light-emitting point with the second electrode and a step of electrically connecting the first electrode and the second electrode by means of an electro-conductive member, the step of electrically connecting the first electrode and the second electrode including arranging the electro-conductive member either by an ink-jet method or a gas deposition method.

DESCRIPTION OF THE PREFERRED EMBODIMENTS

A wire connection structure for light-emitting display according to the invention has light-emitting points formed by third electrodes and second electrodes, each second electrode being electrically connected to a lead-out electrode (first electrode) by way of an electro-conductive member, and is characterized by comprising electro-conductive members for electrically connecting the second electrodes and the first electrodes respectively, said electro-conductive members being formed either by an ink-jet method or a gas deposition method.

First Embodiment

Figure 1:
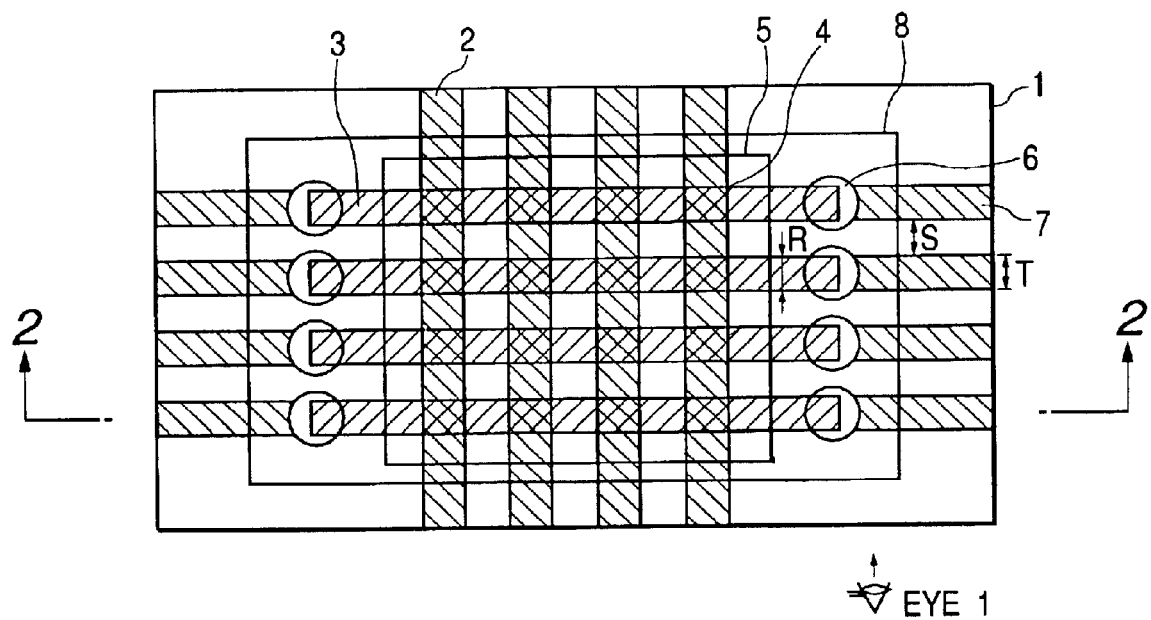
FIG. 1 is a schematic plan view of the first embodiment of wire connection structure according to the invention.

FIG. 1 is a schematic plan view of the simple matrix wiring arrangement of the first embodiment of wire connection structure according to the invention.

In FIG. 1, there are shown a substrate 1, third electrodes 2, second electrodes 3, pixel sections 4, an organic layer 5, electro-conductive members 6, lead-out electrodes (first electrodes) 7 and a sealing boundary line 8.

As seen from FIG. 1, a number of third electrodes 2 are arranged in parallel with each other on the substrate. A number of second electrodes 3 are arranged also in parallel with each other on the third electrodes 2 with an organic layer 5 interposed between them. The longitudinal direction of the third electrodes 2 and that of the second electrodes 3 intersect each other. The pixel sections 4 comprise the intersections.

The organic layer 5 emits light at a pixel section when an electric field (an electric current in particular) is applied between the third electrode 2 and the second electrode 3. Emitted light is transmitted through the substrate to the outside.

The electro-conductive members 6 are used to establish electric connection respectively between the second electrodes 3 and the corresponding lead-out electrodes 7. When viewed from above, it will be seen that each electro-conductive member 6 protrudes laterally from the corresponding second electrode 3 having a width R or from the corresponding lead-out electrode 7 having a width T and that each of the second electrodes 3 lies at the opposite ends thereof on the corresponding electro-conductive members 6. The lead-out electrodes 7 have a designed width T and a given height. In other words, they are substantially rectangular parallelepipeds having a top side, lateral sides and a front side, which may be warped to some extent. The first electrodes are very thin if compared with the substrate 1.

Thus, a set of a second electrode 3, an electro-conductive member 6 and a lead-out electrode 7 is formed for each second electrode 3 and a number of such sets are arranged on the substrate 1. While each electro-conductive member 6 protrudes laterally from the corresponding second electrode 3 having a width R or from the corresponding lead-out electrode 7 having a width T when viewed from above as pointed out above, it does not contact either of the adjacently located electro-conductive members.

The sealing boundary line 8 is shown in FIG. 1 only for the purpose of convenience so as to visualize the region to be sealed by a sealing means (not shown) if such a sealing means needs to be provided. If necessary, such a sealing means (not shown) is provided in order to hermetically seal the inside of the region defined by the sealing boundary line 8 and fend off the atmosphere (moisture contained in the atmosphere in particular). Such a sealing means is typically made of resin that is applied onto the substrate after forming the pixels so as to cover the latter. Alternatively, it may be made of film. Still alternatively, it may be a sort of box (seal box) that is open at a side and put on the effective display region of the matrix wiring arrangement to cover the latter. The electro-conductive members 6 are found in the inner region defined by the sealing boundary line 8.

Figure 2:
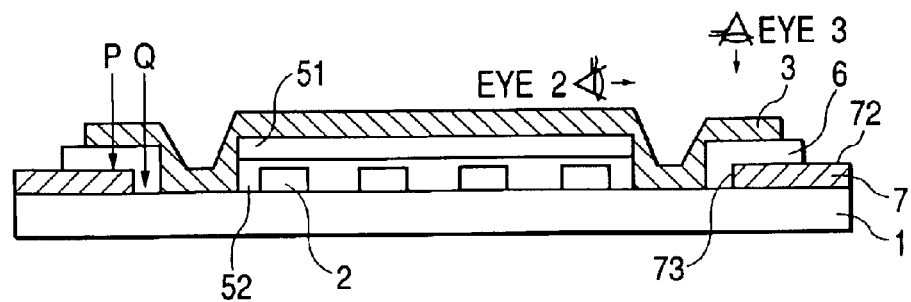
FIG. 2 is a schematic cross sectional view of the first embodiment taken along line 2—2 in FIG. 1.

FIG. 2 is a schematic cross sectional view of the embodiment taken along line 2—2 in FIG. 1, illustrating the profile of a pair of electro-conductive members 6 connecting respective lead-out electrodes 7 to a corresponding second electrode 3. As shown in FIG. 2, each electro-conductive member 6 is designed to embrace the end of the corresponding lead-out electrode 7 located close to the pixel sections 4. More specifically, it will be seen from FIG. 2 that each electro-conductive member 6 covers part of the top side 72 and the front side 73 of the corresponding lead-out electrode 7.

In this embodiment, the organic layer 5 comprises a hole injection layer 52, a light emitting layer and an electron transport layer 51.

As far as this embodiment is concerned, the expression of "the top side" of a lead-out electrode 7 refers to the area of the top side of the lead-out electrode 7 that is visible when viewed from above as in FIG. 1, in other words visible to the eye 3 in FIG. 2. Similarly, the expression of "the front side" of a lead-out electrode 7 refers to the area of the front side that is visible to the eye 2 in FIG. 2. The expression of "the lateral side" of a lead-out electrode 7 refers to the area of the lateral side that is visible to the eye 1 in FIG. 1. These will be described further below by referring to FIG. 3.

Figure 3:
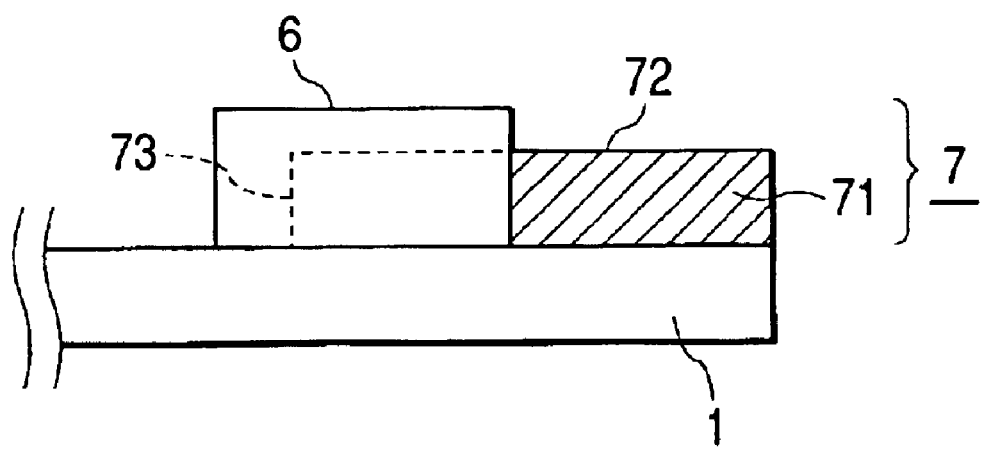
FIG. 3 is a schematic lateral view of a lead-out electrode and a corresponding electro-conductive member as viewed by the eye 1 in FIG. 1.

FIG. 3 is a schematic lateral view of an electro-conductive member 6 connecting a second electrode 3 and a lead-out electrode 7 as viewed by the eye 1 in FIG. 1. It will be seen from FIG. 3 that the electro-conductive member 6 covers not only the top side 72 and the front side 73 but also the lateral sides 71 of the lead-out electrode 7.

Figure 4:
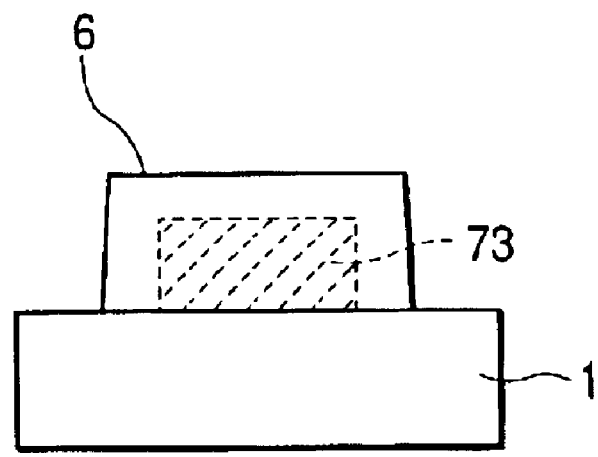
FIG. 4 is a schematic front view of an electro-conductive member as viewed by the eye 2 in FIG. 2.

FIG. 4 also illustrates how the electro-conductive member 6 covers the lead-out electrode as viewed by the eye 2 in FIG. 2. In FIG. 4, the front side 73 of the lead-out electrode 7 is indicated by a broken line because it is covered by the electro-conductive member 6.

As described above by referring to FIGS. 1, 2, 3 and 4, each lead-out electrode 7 is covered by an electro-conductive member 6 at the top side, the lateral sides and the front side. The term "cover" as used herein refers to a state where the electro-conductive member 6 contacts well with the top side 72 of the lead-out electrode 7, although it may contact neither with the front side 73 nor with the lateral sides 71. It will be appreciated, however, that the second electrode 3 and the lead-out electrode 7 can be made to electrically contact with each other more reliably when the electro-conductive member 6 also contact with the front side 73 and the lateral sides 71 of the lead-out electrode 7 because of an enlarged contact area. Then, additionally, the second electrode 3 is also made to contact with the electro-conductive member 6 more reliably because the former contacts with the top side and the front side of the latter to secure a relatively large contact area. While the electro-conductive member 6 may have any height (see FIG. 2) so long as the second electrode 3 and the lead-out electrode 7 electrically contact with each other reliably by way of the electro-conductive member 6, it is not extremely lowly profiled if compared with the second electrode and the lead-out electrode. Rather, it has a height close to that of the second electrode and that of the lead-out electrode. Additionally, the front wall of the electro-conductive member 6 (between the front end of the corresponding lead-out electrode 7 and the opposite end of the second electrode 3 located close to the pixel sections 4 in FIG. 2) has a sufficient thickness from the viewpoint of electric connection.

Furthermore, the lead-out electrode 7 and the second electrode 3 are connected with each other by way the electro-conductive member 6. In other words, the second electrode 3 and the lead-out electrode 7 are not connected with each other directly. With this arrangement, if water comes into the scene, any possible formation of a galvanic cell involving the two elements (the second electrode 3 and the lead-out electrode 7) and water is reliably prevented from taking place. Thus, either of the second electrode 3 or the lead-out electrode 7 is prevented from being corroded. If the second electrode 3 is made of aluminum and the lead-out electrode 7 is made of ITO, the electro-conductive member 6 is preferably made of chromium. Then, the chromium of the electro-conductive member 6 minimizes the electric loss that can occur between the aluminum of the second electrode 3 and the ITO of the lead-out electrode 7 and maintains the electric connection between the two electrodes.

Additionally, the electro-conductive member 6 is made of a material having a high melting point. The lead-out electrode 7 and the second electrode 3 can become corroded when they are made of respective materials that are different from each other and water is found between the lead-out electrode 7 and the electro-conductive member 6 and/or between the second electrode 3 and the electro-conductive member 6. Therefore, the material of the electro-conductive member 6 is preferably so selected as to prevent such corrosion from taking place. When water is found between the lead-out electrode 7 and the electro-conductive member 6 and/or between the second electrode 3 and the electro-conductive member 6, a galvanic cell can be formed and an electric current can flow there. Therefore, the material of the electro-conductive member 6 is preferably so selected as to minimize such an electric current and prevent corrosion from taking place. Furthermore, it is preferable that the electrode potential of the electro-conductive member 6 is between the electrode potential of the lead-out electrode 7 and that of the second electrode 3. The electro-conductive member 6 may be made of solid metal (which may be an alloy) or a metal complex (electro-conductive complex to be more accurate). An electro-conductive member 6 that covers a corresponding lead-out electrode 7 at an end of the latter can be formed by using such a material and applying an ink-jet method or a gas deposition method.

As far as this embodiment is concerned, an ink-jet method or a gas deposition method refers to a technique of shooting a given amount of the material of the electro-conductive member 6 with fluid to a target position and spreading it over a target area. Particularly, an ink-jet method to be used for this embodiment is adapted to dissolve or disperse the material of the electro-conductive member 6 into fluid, or liquid, and shoot the dissolved or dispersed material as object to be shot. Any appropriate known ink-jet method may be selected and the amount of fluid containing the material of the electro-conductive member 6 that is shot at a time and the position or timing for shooting the fluid may be determined appropriately according to the selected ink-jet method. A gas deposition method to be used for this embodiment is adapted to use gas and make it contain (solid fine particles of) the material of the electro-conductive member 6 so that gas containing the material of the electro-conductive member 6 may be shot as object to be shot. Any appropriate known gas deposition method may be selected and the amount of gas containing the material of the electro-conductive member 6 that is shot at a time and the position or timing for shooting the gas may be determined appropriately according to the selected gas deposition method. A gas deposition method to be used for this embodiment may be a jet printing method. Such an ink-jet method or a gas deposition method may be referred to as a direct drawing method.

The material of the electro-conductive member 6 can be dissolved into a solvent when an ink-jet method is employed. Additionally, the electro-conductive member 6 can be made to show a smooth profile because a diffused state can be realized in a desired manner for the material of the electro-conductive member 6 by controlling the fluidity (viscosity) of the liquid containing the material and/or the conditions for evaporating the liquid. Although not shown, the electro-conductive member 6 can be made to show a smoothly inclined or curved profile mildly falling from the top side 72 onto the substrate 1 at a position near the front side 73 of the lead-out electrode 7. Then, the second electrode 3 is also made to show the same profile. Such a second electrode 3 may be free from the problem of broken wire. The solvent is evaporated as it is heated or left under reduced pressure and allowed to gasify.

When a gas deposition method is used, a material that is not soluble to a solvent may be used for the electro-conductive member 6. Additionally, a gas deposition method does not need a step of heating liquid because no liquid is used. As a result, the entire substrate, particularly the organic layer 5, is free from undesired heat if the electro-conductive member 6 is formed after forming any of the component layers of the organic layer 5 because no liquid is used and hence no heating step is required to evaporate liquid.

The use of an ink-jet method or a gas deposition method is economically advantageous because it is not necessary to use a costly process such as sputtering that involves a treatment in vacuum.

Now, the target position at which the object to be shot will be discussed below. The following description applies to both the ink-jet method and the gas deposition method.

In FIG. 2, P and Q denote target positions at which the material of the electro-conductive member 6 may be shot. The position P is located on the top side of the lead-out electrode 7, while the position Q is located not on the top side of the lead-out electrode 7 but at a point slightly moved away from the front side 73 of the lead-out electrode 7 toward the pixel sections 4 (on the substrate 1). Preferably, the position P is selected as target position. If an ink-jet method or a gas deposition method is used, the object that is shot at and hits the target position P then spreads from the position P typically in an isotropic manner. The selection of the target position P is advantageous and convenient because the object that is shot then spreads and gets to the top side 72, the lateral sides 71 and the front side 73 of the lead-out electrode 7. The object that is shot at the target position Q may grow to a certain extent if it does not spread remarkably on the surface of the substrate 1 and is allowed to grow vertically from the surface of the substrate (upward in FIG. 2). An appropriate position between the position P and the position Q may be selected as target position for forming the electro-conductive member 6.

The ingredients of the object to be shot may be selected from the viewpoint of the interface energy (wetting property) of the object to be shot and the target with which the object contacts regardless if an ink-jet method or a gas deposition method is used. However, if the object to be shot is liquid, it preferably has a good wetting property.

It is possible to make the electro-conductive member 6 not laterally protrude from the second electrode 3 having a width of R or from the lead-out electrode 7 having a width of T as viewed from above if the conditions under which the electro-conductive member 6 is formed are selected on the basis of the above description. If the electro-conductive member 6 is made to protrude laterally only to a minimal extent, a high definition (high resolution) display panel can be realized if the gap S between a set of a second electrode 3, an electro-conductive member 6 and a lead-out electrode 7 and an adjacently located set is made very small.

As pointed out above, a number of sets, each including a second electrode 3, an electro-conductive member 6 and a lead-out electrode 7, are arranged on a substrate. Therefore, a head having as many ejection orifices as the electro-conductive members 6 of the sets to be formed may be used for this embodiment. The ejection orifices should be located at respective positions good for forming the electro-conductive members 6.

Second Embodiment

The second embodiment of wire connection structure according to the invention differs from the first embodiment in that first electrodes are separated respectively from the corresponding second electrodes by a gap in the horizontal direction on the substrate and an electro-conductive member is arranged in each of the gaps. Otherwise, the second embodiment has a configuration same as that of the first embodiment.

Figure 5:
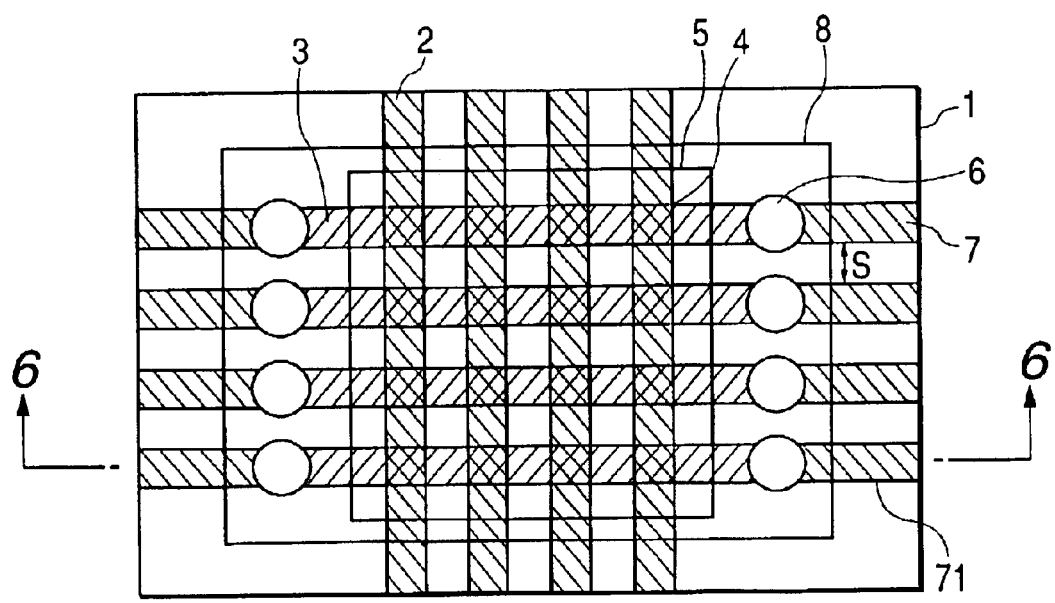
FIG. 5 is a schematic plan view of the second embodiment of wire connection structure according to the invention.

FIG. 5 is a schematic plan view of the simple matrix wiring arrangement of the second embodiment of wire connection structure according to the invention.

As shown in FIG. 5, an electro-conductive member 6 covers a second electrode 3 and a corresponding lead-out electrode 7 at the closely and oppositely disposed respective ends thereof. More specifically, the electro-conductive member 6 covers at least the front side 73 and the top side 72 of the lead-out electrode. Of course, the electro-conductive member 6 may also covers the lateral sides 71 of the lead-out electrode. The electro-conductive member 6 has a substantially circular contour because it is formed by spreading an electro-conductive material there.

The closely and oppositely disposed respective ends of the lead-out electrode 7 and the second electrode 3 are arranged substantially in parallel with each other although they are not shown in FIG. 5 because they are covered by the electro-conductive member 6.

Figure 6:
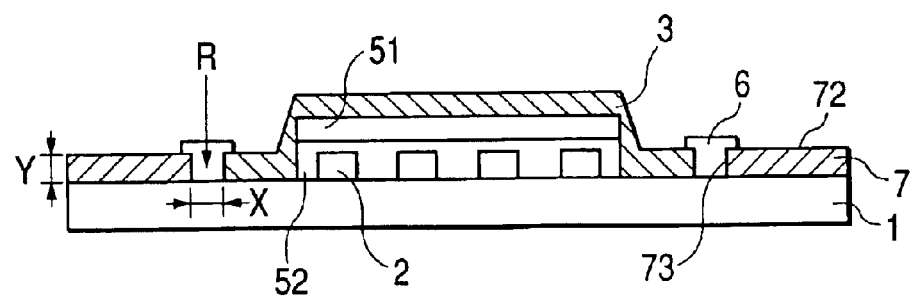
FIG. 6 is a schematic cross sectional view of the second embodiment taken along line 6—6 in FIG. 5.

FIG. 6 is a schematic cross sectional view of the second embodiment taken along line 6—6 in FIG. 5, illustrating the profile of a set of a lead-out electrode 7, an electro-conductive member and a second electrode 3. As shown in FIG. 6, each of the electro-conductive members 6 covers the top side of the corresponding lead-out electrode 7 and that of the second electrode 3 at the oppositely disposed ends thereof.

This embodiment can also be formed by applying an ink-jet method or a gas deposition method.

The target position of an object to be shot is indicated by reference symbol R in FIG. 6. The position R is located in the gap separating a lead-out electrode 7 and a corresponding second electrode 3. No means is provided at this position to prevent the object shot there from spreading in the lateral direction of the embodiment. Therefore, the conditions in which the electro-conductive member 6 is formed need to be defined appropriately in such a way that the shot object may not spread laterally to an excessive extent on the substrate 1 but may have a substantial height in the gap between the lead-out electrode 7 and the second electrode 3 in the direction of the height Y of the electrodes (as observed in a direction perpendicular relative to the surface of the substrate 1) and cover both the top side of the lead-out electrode 7 and that of the second electrode 3 at the closely and oppositely disposed respective ends of the electrodes. Preferably, the ratio of the height Y of the electrodes to the horizontal length X of the gap between the lead-out electrode 7 and the second electrode 3 (as observed in a direction parallel to the surface of the substrate 1) is taken into consideration when defining the conditions. More specifically, it is desirable that the length X is short relative to the height Y. Additionally, as in the case of the first embodiment, the wetting property of the object to be shot and the target that is hit by the object, the viscosity of the object to be shot and the size of each object to be shot (the size of each droplet or that of each solid micro-particle) are also preferably taken into consideration.

Third Embodiment

The third embodiment of wire connection structure according to the invention differs from the first embodiment in that the first electrodes 7 are realized in the form of flexible printed wires. Otherwise, the third embodiment is identical with the first embodiment.

Figure 7:
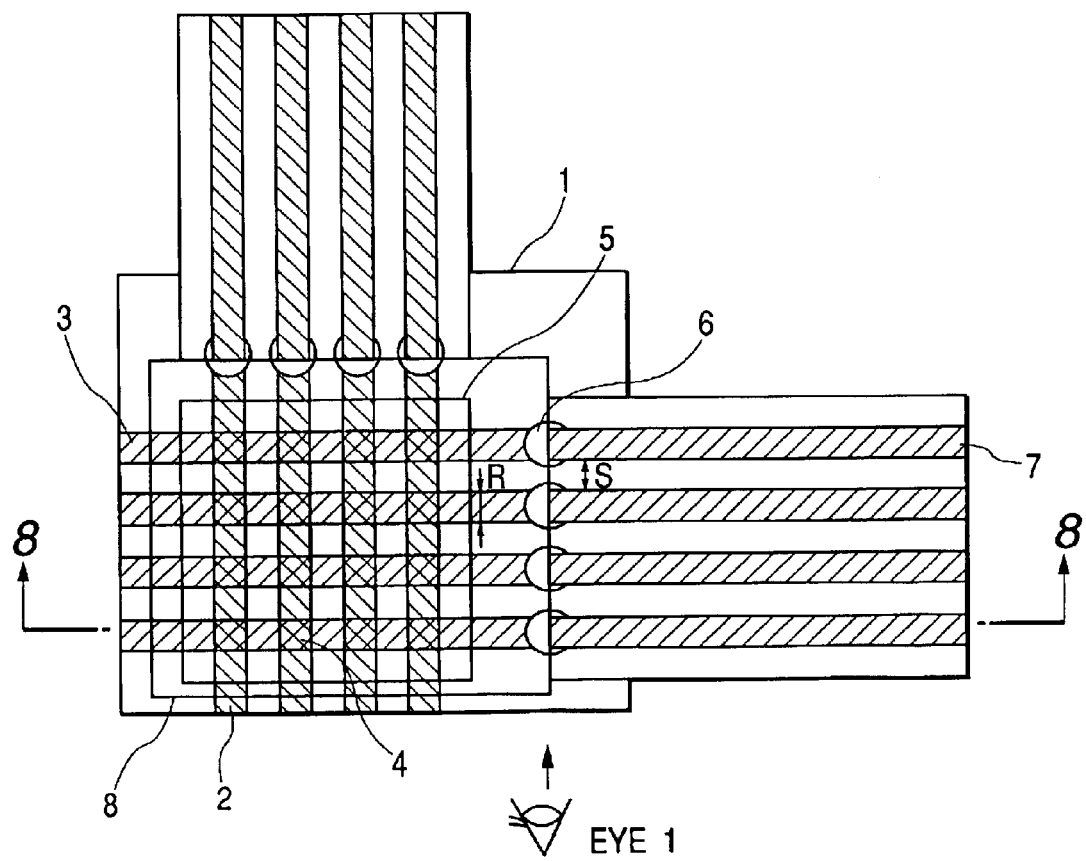
FIG. 7 is a schematic plan view of the third embodiment of wire connection structure according to the invention.

FIG. 7 is a schematic plan view of the simple matrix wiring arrangement of the third embodiment of wire connection structure according to the invention. Each flexible printed wire 7 is electrically connected to a corresponding second electrode 3 by way of an electro-conductive member 6. The flexible printed wires 7 are rigidly secured to the substrate 1 by means of an adhesive agent (not shown) (and by way of an adhesive layer 9 shown in FIG. 8). Each third electrode 2 is also connected to another related flexible electrode 7 by way of respective electro-conductive member 6.

The second electrodes 3 have a designed width R and a given height. In other words, they are substantially rectangular parallelepipeds having a top side, lateral sides and a front side. The second electrodes 3 are very thin if compared with the substrate 1.

It is desirable that the electro-conductive members 6 are found in the inside of the region defined by a sealing boundary line 8. In FIG. 7, the electro-conductive members 6 are so arranged as to bestride the sealing boundary line 8. In other words, each of the electro-conductive members 6 is located partly in the sealed region and partly out of the sealed region. Although not illustrated, the electro-conductive members 6 may totally be found within the sealed region. A seal box may be used to define the sealed region as described earlier.

Figure 8:
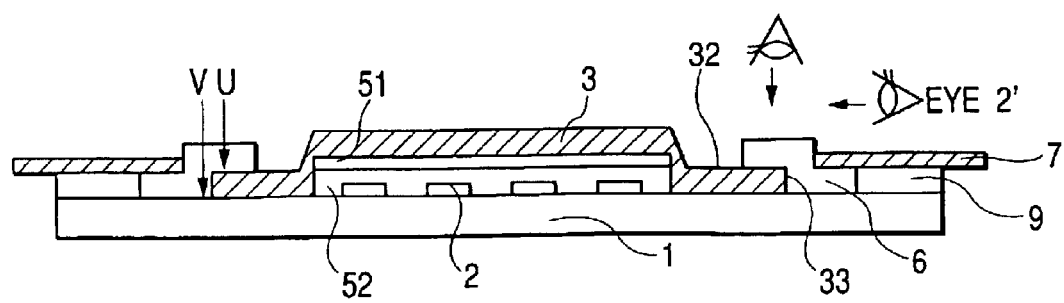
FIG. 8 is a schematic cross sectional view of the third embodiment taken along line 8—8 in FIG. 7.

FIG. 8 is a schematic cross sectional view of the third embodiment taken along line 8—8 in FIG. 7, illustrating the profile of a pair of electro-conductive members connecting respective flexible printed wires 7 to a corresponding second electrode 3. As shown in FIG. 8, each of the electro-conductive members 6 covers the end of the corresponding flexible printed wire 7 that is located close to the corresponding second electrode 3. Furthermore, in FIG. 8, the electro-conductive member 6 covers a part of the top side 32 and the front side 33 of the corresponding second electrode 3.

The electro-conductive member 6 is electrically connected to the flexible printed wire 7 at the bottom side of the latter. This is because the adhesive layer 9 is sufficiently separated from the front side of the second electrode 3 and hence the electro-conductive member 6 can be arranged under the flexible printed wire 6. The expression of "the front side" as used herein to describe this embodiment refers to the area that is visible to the eye 2' in FIG. 8.

The description on the top side and the lateral sides given above for the first embodiment is also applicable to this embodiment.

Figure 9:
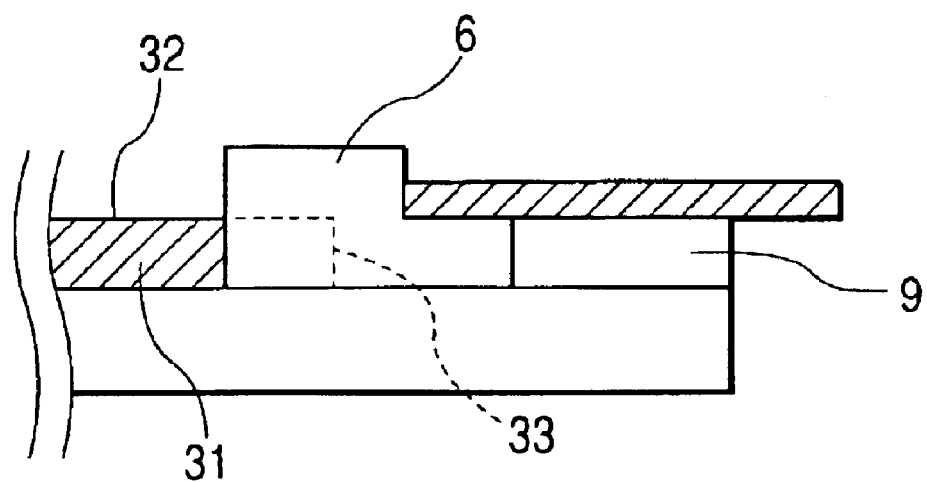
FIG. 9 is a schematic lateral view of a lead-out electrode and a corresponding electro-conductive member as viewed by the eye 1 in FIG. 7.
Figure 10:
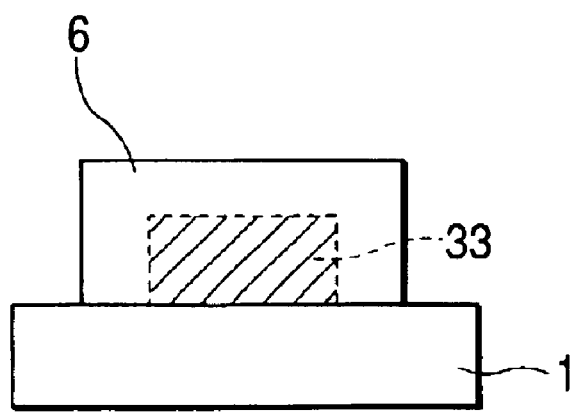
FIG. 10 is a schematic front view of an electro-conductive member as viewed by the eye 2' in FIG. 8.

FIG. 9 is a schematic lateral view of an electro-conductive member 6 connecting a set of a second electrode 3 and a flexible printed wire 7 as viewed by the eye 1 in FIG. 7. It will be seen from FIG. 9 that the electro-conductive member 6 covers not only the top side 32 and the front side 33 but also the lateral sides 31 of the second electrode 3. FIG. 10 also illustrates how the electro-conductive member 6 covers the second electrode 3 as viewed from the eye 2' in FIG. 8. The contour of the front side 33 of the second electrode 3 is indicated by a broken line in FIG. 10 because it is covered by the electro-conductive member 6 and placed remotely when viewed from the eye 2' in FIG. 8. As described above by referring to FIGS. 7, 8, 9 and 10, each second electrode 3 is covered by an electro-conductive member 6 at the top side, the lateral sides and the front side. The term "cover" as used herein refers to a state where the electro-conductive member 6 contacts well with the top side 32 of the second electrode 3, although it may contact neither with the front side 33 nor with the lateral sides 31. It will be appreciated, however, that the second electrode 3 and the flexible printed wire 7 can be made to electrically contact with each other more reliably when the electro-conductive member 6 contacts with the front side 33 and the lateral sides 31 of the second electrode 3 because of an enlarged contact area. While the electro-conductive member 6 may have any height (see FIG. 8) so long as the second electrode 3 and the flexible printed wire 7 electrically contact with each other reliably by way of the electro-conductive member 6, it is not extremely lowly profiled if compared with the second electrode and the lead-out electrode. Rather, it has a height close to that of the second electrode and that of the flexible printed wire. Additionally, the front wall of the electro-conductive member 6 (between the front end of the corresponding flexible printed wire 7 and the opposite end of the second electrode 3 located close to the pixel section 4 in FIG. 8) has a sufficient thickness from the viewpoint of electric connection. Furthermore, the flexible printed wire 7 and the second electrode are connected with each other by way of the electro-conductive member 6. In other words, the second electrode 3 and the flexible printed wire 7 are not connected with each other directly. With this arrangement, if water comes into the scene, any possible formation of a galvanic cell involving the two elements (the second electrode 3 and the flexible printed wire 7) by way of water is reliably prevented from taking place. Additionally, and at least either the second electrode 3 or the flexible printed wire 7 is prevented from being corroded. If the second electrode 3 is made of aluminum and the flexible printed wire 7 is made of copper, the electro-conductive member 6 is preferably made of nickel. Then, the nickel of the electro-conductive member 6 minimizes the electric loss that can occur between the aluminum of the second electrode 3 and the copper of the flexible printed wire 7 and maintains a favorable electric connection between them. Additionally, the electro-conductive member 6 is made of a material having a high melting point. The flexible printed wire 7 and the second electrode 3 can become corroded when they are made of respective materials that are different from each other and water or the like is found between the flexible printed wire 7 and the electro-conductive member 6 and/or between the second electrode 3 and the electro-conductive member 6. Therefore, the material of the electro-conductive member 6 is preferably so selected as to prevent such corrosion from taking place. When water is found between the flexible printed wire 7 and the electro-conductive member 6 and/or between the second electrode 3 and the electro-conductive member 6, a galvanic cell can be formed and an electric current can flow there. Therefore, the material of the electro-conductive member 6 is preferably so selected as to minimize such an electric current and prevent corrosion from taking place. Furthermore, it is preferable that the electrode potential of the electro-conductive member 6 is found between the electrode potential of the flexible printed wire 7 and that of the second electrode 3. The electro-conductive member 6 may be made of solid metal (which may be an alloy) or a metal complex (electro-conductive complex to be more accurate). An electro-conductive member 6 that covers a second electrode 3 at an end of the latter can be formed by using such a material and applying an ink-jet method or a gas deposition method.

The material of the electro-conductive member ejected by an ink-jet method or a gas deposition method can easily goes to the underside of the flexible printed wire 7 between the second electrode 3 and the adhesive layer 9.

Now, the target position at which the object to be shot will be discussed below. The following description applies to both the ink-jet method and the gas deposition method. In FIG. 8, U and V denote target positions at which the material of the electro-conductive member 6 may be shot. The position U is located on the top side of the second electrode 3, while the position V is located not on the top side of the second electrode 3 but at a point slightly moved away from the front side 33 of the second electrode 3 toward the related end of the substrate 1. Preferably, the position U is selected as target position. If an ink-jet method or a gas deposition method is used, the object that is shot at and hits the target position U then spreads from the position U typically in an isotropic manner. The selection of the target position U is advantageous and convenient because the object that is shot then spreads and gets to the top side 32, the lateral sides 31 and the front side 33 of the second electrode 3. The object that is shot at the target position V may grow to a certain extent if it does not spread remarkably on the surface of the substrate 1 and is allowed to grow vertically from the surface of the substrate (upward in FIG. 2). An appropriate position between the position U and the position V may be selected as target position for forming the electro-conductive member 6.

As described earlier by referring to the first embodiment, it is possible in this embodiment to make the electro-conductive member 6 not laterally protrude from the second electrode 3 having a width of R or from the flexible printed wire 7 having a width of T as viewed from above if the conditions under which the electro-conductive member 6 is formed are selected on the basis of the above description. If the electro-conductive member 6 is made to protrude laterally only to a minimal extent, a high definition (high resolution) display panel can be realized if the gap S between a set of a second electrode 3, an electro-conductive member 6 and a lead-out electrode 7 and an adjacently located set is made very small.

As pointed out above, a number of sets, each including a second electrode 3, an electro-conductive member 6 and a flexible printed wire 7, are arranged on a substrate. Therefore, a head having as many ejection orifices as the electro-conductive members 6 of the sets to be formed may be used for this embodiment. The ejection orifices should be located at respective positions good for forming the electro-conductive members 6.

Fourth Embodiment

Figure 11:
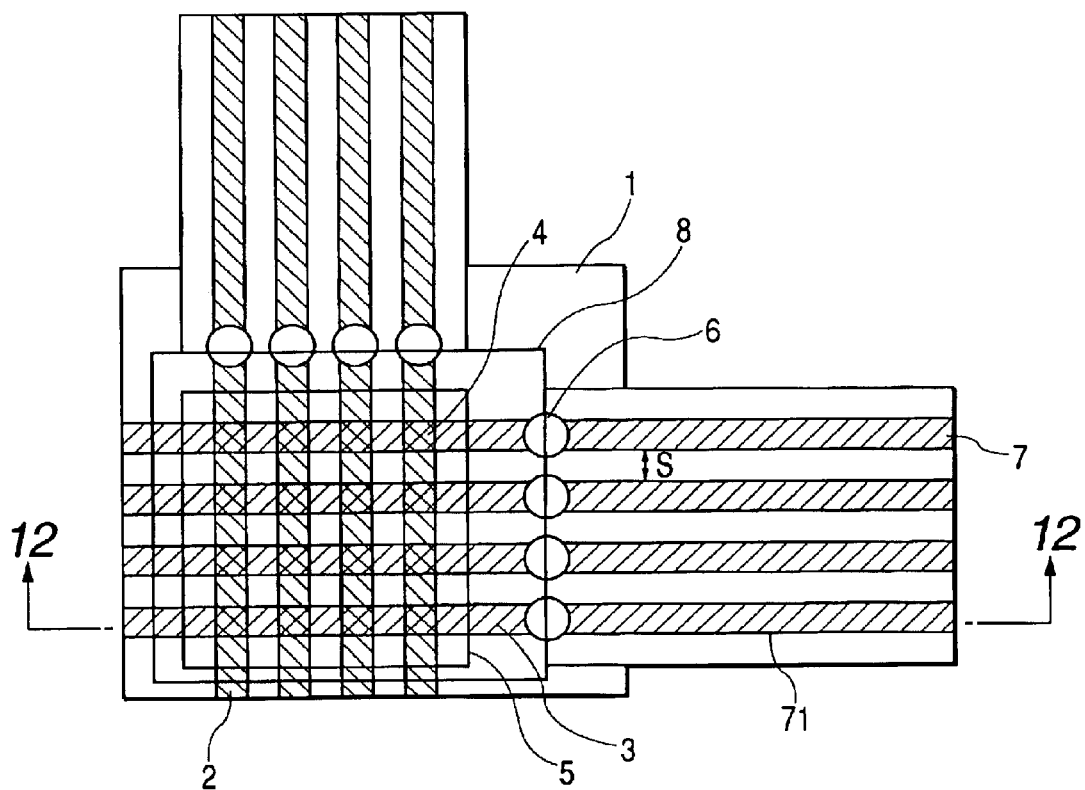
FIG. 11 is a schematic plan view of the fourth embodiment of wire connection structure according to the invention.
Figure 12:
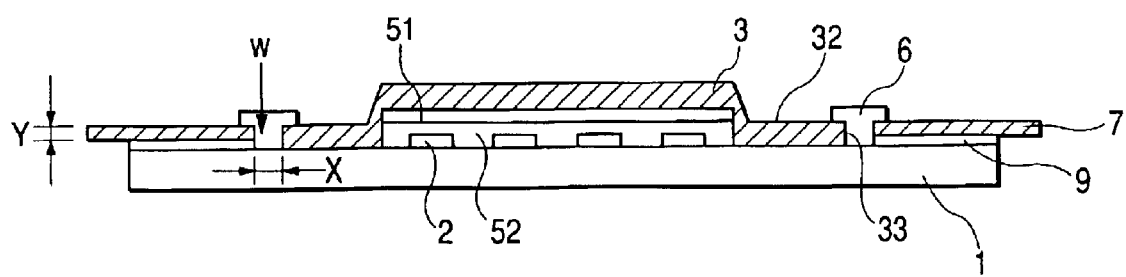
FIG. 12 is a schematic cross sectional view of the fourth embodiment taken along line 12—12 in FIG. 11.

The fourth embodiment of wire connection structure according to the invention differs from the third embodiment in that the adhesive layer 9 is formed even right under the related end of the corresponding flexible printed wire 7 and the electro-conductive member 6 electrically contacts with the flexible printed wire on the top side of the latter. Otherwise, the fourth embodiment has a configuration same as that of the third embodiment. FIG. 11 is a schematic plan view of the simple matrix wiring arrangement of the fourth embodiment of wire connection structure according to the invention. As shown in FIG. 11, an electro-conductive member 6 covers a second electrode 3 and a corresponding flexible printed wire 7 at the closely and oppositely disposed respective ends thereof. More specifically, the electro-conductive member 6 covers at least the front side 33 and the top side 32 of the second electrode 3. Of course, the electro-conductive member 6 may also covers the lateral sides 31 of the second electrode 3. The electro-conductive member 6 has a substantially circular contour because it is formed by spreading an electro-conductive material there. The closely and oppositely disposed respective ends of the flexible printed wire 7 and the second electrode 3 are arranged substantially in parallel with each other although they are not shown in FIG. 11 because they are covered by the electro-conductive member 6. FIG. 12 is a schematic cross sectional view of the fourth embodiment taken along line 12—12 in FIG. 11, illustrating the profile of a set of a flexible printed wire 7, an electro-conductive member 6 and a second electrode 3. As shown in FIG. 12, each of the electro-conductive members 6 covers the top side of the corresponding flexible printed wire 7 and that of the second electrode 3 at the oppositely disposed ends thereof. This embodiment can also be formed by applying an ink-jet method or a gas deposition method. The target position of an object to be shot is indicated by reference symbol W in FIG. 12. The position W is located in the gap separating a flexible printed wire 7 and a corresponding second electrode 3. No means is provided at this position to prevent the object shot there from spreading in the lateral direction of the embodiment. Therefore, the conditions in which the electro-conductive member 6 is formed need to be defined appropriately in such a way that the shot object may not spread laterally to an excessive extent on the substrate 1 but may have a substantial height in the gap between the flexible printed wire 7 and the second electrode 3 in the direction of the height Y of the electrodes (as observed in a direction perpendicular relative to the surface of the substrate 1) and cover both the top side of the flexible printed wire 7 and that of the second electrode 3 at the closely and oppositely disposed respective ends of them. Preferably, the ratio of the height Y of the electrodes to the horizontal length X (as observed in a direction parallel to the surface of the substrate 1) of the gap between the flexible printed wire 7 and the second electrode 3 is taken into consideration when defining the conditions. More specifically, it is desirable that the length X is short relative to the height Y. Additionally, as in the case of the first embodiment, the wetting property of the object to be shot and the target that is hit by the object, the viscosity of the object to be shot and the size of each object to be shot (the size of each droplet and that of each solid micro-particle) are also preferably taken into consideration.

An electrode connection structure according to the invention can be applied to a light source for irradiating a photosensitive body with light beams. Therefore, it can be used not only for a simple matrix type display apparatus as described above by referring to the first and fourth embodiments but also for an active matrix type display apparatus and an electrophotography type image forming apparatus such as a laser beam printer or a copying machine. An electrode connection structure according to the invention can also be applied to a light source to be used for illumination. For the purpose of the present invention, the light emitting points as pixels may be self-emission type elements including organic electroluminescent (organic EL) elements, inorganic electroluminescent elements or laser elements or non-emission type elements including liquid crystal elements that are provided with light bulbs.

Figure 13:
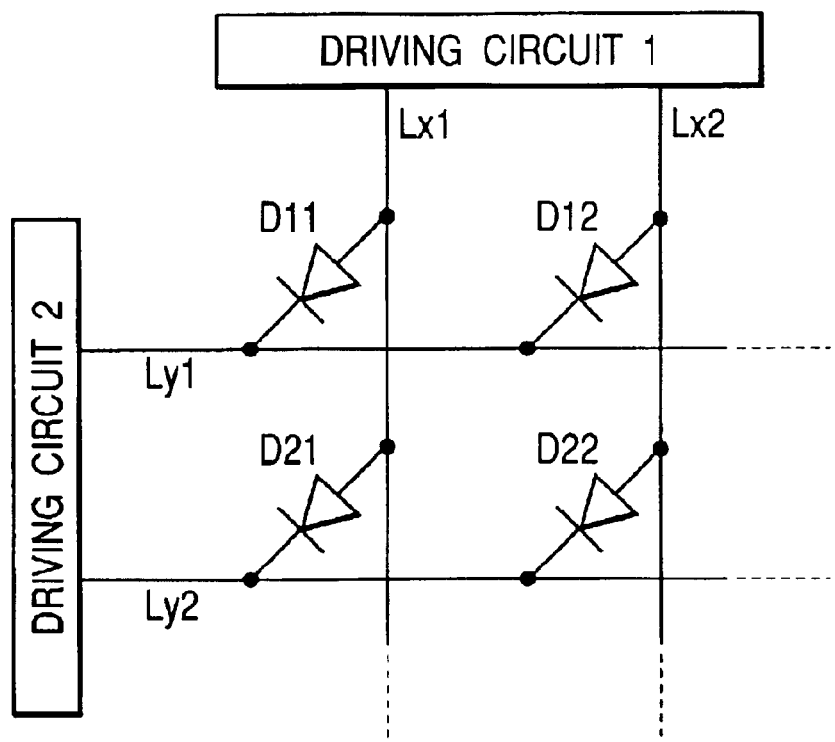
FIG. 13 is a schematic circuit diagram of an organic EL display apparatus having a simple matrix drive to which the manufacturing method according to the invention can apply.
Figure 14:
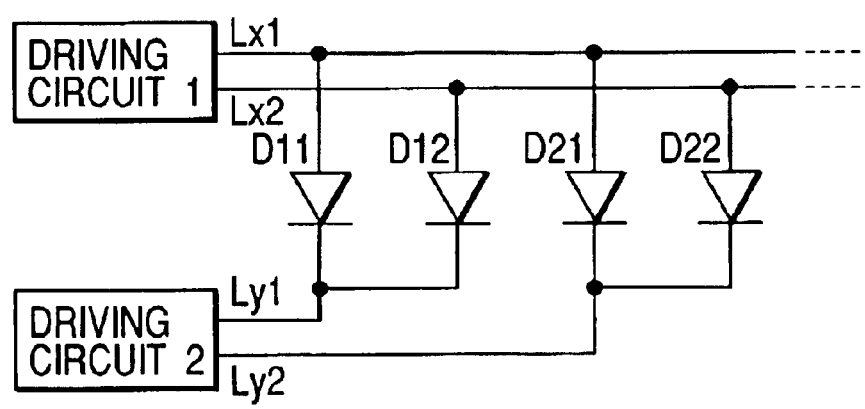
FIG. 14 is a schematic circuit diagram of an organic EL exposure light source having a simple matrix drive to which the manufacturing method according to the invention can apply.
Figure 15:
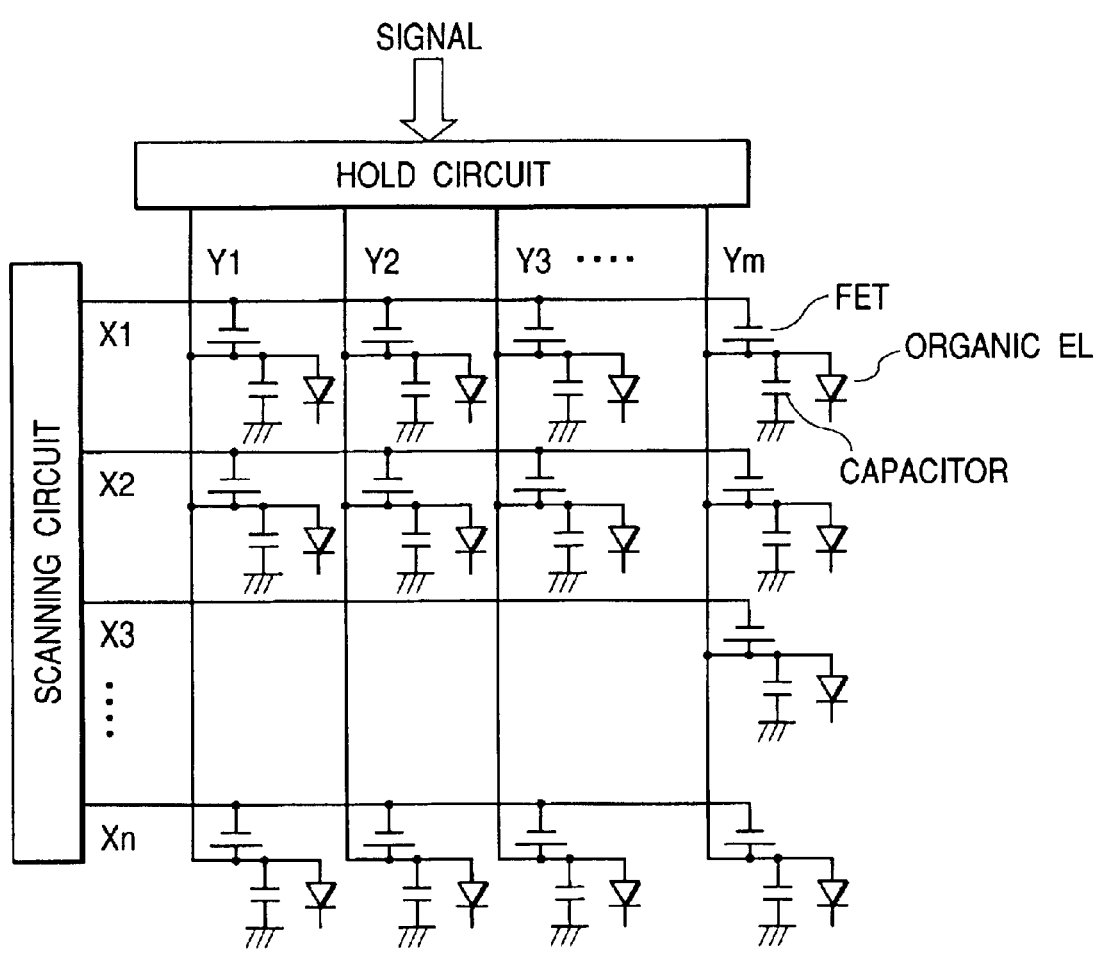
FIG. 15 is a schematic circuit diagram of an organic EL display apparatus having an active matrix drive to which the manufacturing method according to the invention can apply.
Figure 16A:
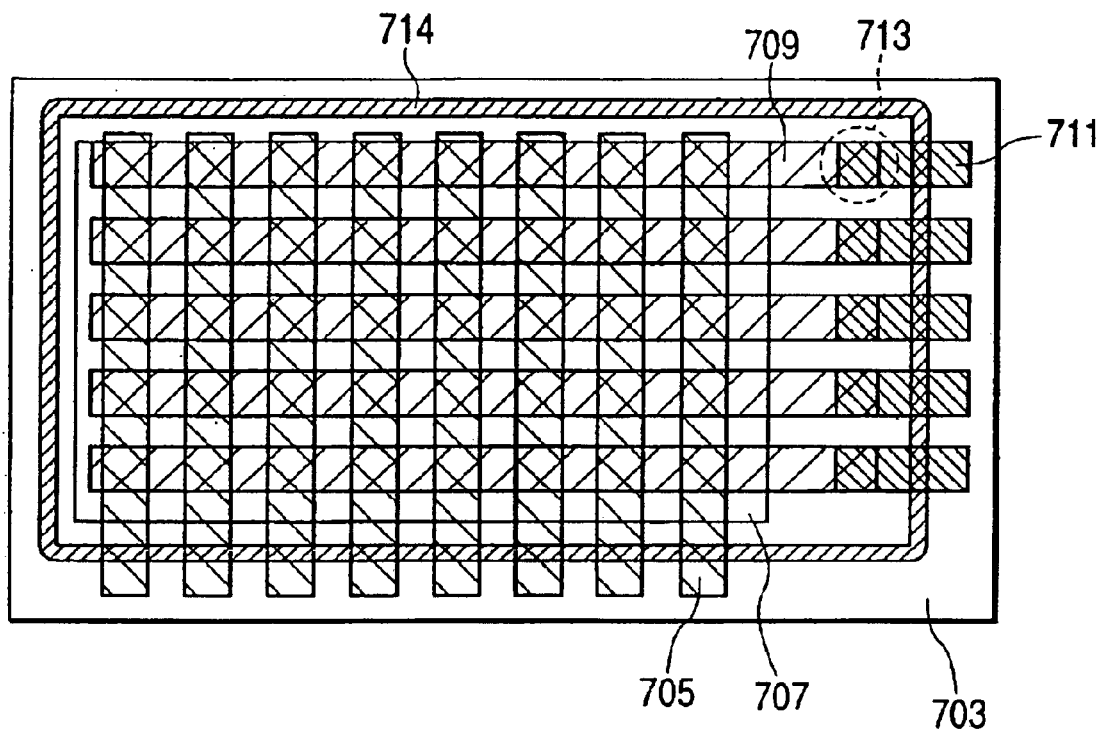
FIG. 16A is a schematic plan view of a known wire connection structure.
Figure 16B:
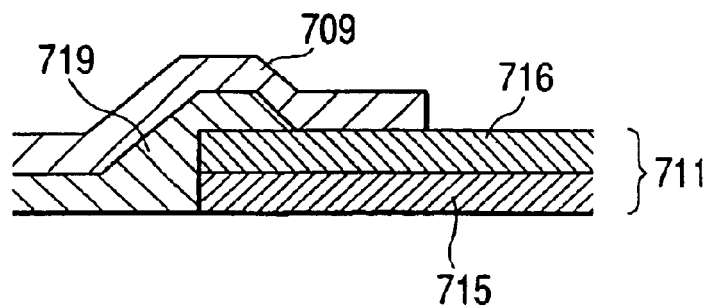
FIG. 16B is a schematic cross sectional view of a part of the known wire connection structure of FIG. 16A, illustrating a part thereof where a cathode lead-out section and a corresponding metal electrode are held in contact with each other.

FIGS. 13, 14 and 15 schematically illustrate apparatus comprising organic EL elements. FIG. 13 shows a simple matrix type display apparatus comprising organic EL elements that are arranged two-dimensionally and FIG. 14 shows a light source of a simple matrix type printer head in which organic EL elements are arranged one-dimensionally. They differ from each other only in terms of arrangement of organic EL elements and principally a same drive method can be used for them. In both FIG. 13 and FIG. 14, an organic EL element D11 (the capacitor section of which is not shown) is connected between an anode wire Lx1 and a cathode wire Ly1 and another organic EL element D21 is connected between the anode wire Lx1 and another cathode wire Ly2, while D12 is connected between Lx2 and Ly1 and D22 is connected between Lx2 and Ly2. In these apparatus, each organic EL element can be driven to emit light independently by applying an appropriate voltage to a selected combination of the anode wires and the cathode wires. Therefore, they can be used to display a variety of patterns of emitted light beams or images.

FIG. 15 shows the drive circuit of an active matrix type display apparatus comprising FETs. The drive method of an active matrix type display apparatus may be either the one that is used with field effect transistors (FETs) or the one that is used with non-linear two-terminal elements. With the drive method that uses FETs, the gate paths X1, X2, . . . , Xn are sequentially scanned by means of a line sequence system so as to temporarily bring all the FETs on each gate path into an ON state and a signal charge is supplied to all the capacitors connected to the FETs that are held in an ON state. The signal charge can drive the organic EL elements until the next frame scanning cycle. An electrode connection structure according to the invention can be applied to the connecting section of an organic EL element and a scan circuit and also to the connecting section of an organic EL element and a hold circuit (signal).

EXAMPLE 1

In this example, the electro-conductive members of the first embodiment of wire connection structure according to the invention were formed by an ink-jet method in a manner as described below.

Referring to FIG. 2, the substrate 1 was made of glass and the third electrodes 2 were made of ITO, while the lead-out electrodes 7 were also made of ITO and the second electrodes 3 were Al—Li, Al electrodes.

Firstly, an ITO layer was formed on the entire surface of the glass substrate 1 by sputtering. Then, the third electrodes 2 and the lead-out electrodes 7 that had respective intended profiles were produced by etching the ITO layer and subjected to a surface treatment for 10 minutes by using UV rays. Thereafter, a Cr complex was ejected from an ink-jet ejection apparatus onto an end of each of the lead-out electrodes 7 and heated at 300° C. for drying. Thus, the lead-out electrodes 7 were covered respectively by the electro-conductive members 6. Subsequently, a hole injection layer was formed by physical evaporation of triphenylamine heximer (TPA-6: molecular weight 1,461, melting point 277° C., Tg 156° C.), which served as hole injection material. Then, a light emitting layer of 8-hydroxyquinoline metal complex, which might typically be tris-(8-quinolinole) aluminum (aluminum quinoline complex) and served as light emitting material, was formed also by physical evaporation. Thereafter, an electron injection layer was formed by physical evaporation of Al—Li, using a mask having through holes corresponding to the pattern of the second electrode layer, and then Al electrodes were formed as second electrodes 3 by physical evaporation of Al. Thus, the sections electrically connecting the lead-out electrodes 7 and the second electrodes 3 had three layers of ITO, Cr and Al so that the ITO and the Al were prevented from being corroded. Finally, the effective display region and the electro-conductive members 6 were hermetically sealed by means of a seal box.

EXAMPLE 2

In this example, the electro-conductive members of the first embodiment of wire connection structure according to the invention were formed by a gas deposition method in a manner as described below.

Referring to FIG. 2, the substrate 1 was made of glass and the third electrodes 2 were made of ITO, while the lead-out electrodes 7 were also made of ITO and the second electrodes 3 were Al—Li, Al electrodes.

Firstly, an ITO layer was formed on the entire surface of the glass substrate 1 by sputtering. Then, the third electrodes 2 and the lead-out electrodes 7 that had respective intended profiles were produced by etching the ITO layer. Thereafter, a Cr film was formed as an electro-conductive member 6 on an end of each of the lead-out electrodes 7 by a gas deposition method. Thus, the lead-out electrodes 7 were covered respectively by the electro-conductive members 6. Subsequently, a hole injection layer was formed by physical evaporation of triphenylamine heximer (TPA-6: molecular weight 1,461, melting point 277° C., Tg 156° C.), which served as hole injection material. Then, a light emitting layer of 8-hydroxyquinoline metal complex, which might typically be tris-(8-quinolinole)aluminum (i.e. aluminum quinoline complex) and served as light emitting material, was formed also by physical evaporation. Thereafter, an electron injection layer was formed by physical evaporation of Al—Li, using a mask having through holes corresponding to the pattern of the second electrodes 3, and then Al electrodes were formed as second electrodes 3 by physical evaporation of Al. Thus, the sections electrically connecting the lead-out electrodes 7 and the second electrodes 3 had three layers of ITO, Cr and Al so that the ITO and the Al were prevented from being corroded. Finally, the effective display region and the electro-conductive members 6 were hermetically sealed by means of a seal box.

EXAMPLE 3

In this example, the electro-conductive members of the second embodiment of wire connection structure according to the invention were formed by an ink-jet method in a manner as described below.

Referring to FIG. 6, the substrate 1 was made of glass and the third electrodes 2 were made of ITO, while the lead-out electrodes 7 were also made of ITO and the second electrodes 3 were AL—Li, Li electrodes.

Firstly, an ITO layer was formed on the entire surface of the glass substrate 1 by sputtering. Then, the third electrodes 2 and the lead-out electrodes 7 that had respective intended profiles were produced by etching the ITO layer. Thereafter, a hole injection layer was formed by coating triphenylamine heximer (TPA-6: molecular weight 1,461, melting point 277° C., Tg 156° C.), which served as hole injection material, by means of a spin coating method, heating it for drying and then removing the unnecessary parts by-means of a laser. Then, a light emitting layer of 8-hydroxyquinoline metal complex, which might typically be tris-(8-quinolinole) aluminum (aluminum quinoline complex) and served as light emitting material, was formed by physical evaporation. Thereafter, an electron injection layer was formed by physical evaporation of Al—Li, using a mask having through holes corresponding to the pattern of the second electrodes 3, and then Al electrodes were formed by physical evaporation of Al in such a way that they were substantially aligned with and separated from the respective lead-out electrodes 7. Subsequently, liquid containing Cr and showing controlled surface tension was ejected from an ink-jet ejection apparatus onto the gaps separating the lead-out electrodes 7 and the corresponding second electrodes 3 and heated to 150° C. for drying to produce the electro-conductive members 6. Thus, each of the sections electrically connecting the lead-out electrodes 7 and the second electrodes 3 had a structure where the Cr layer is sandwiched between the ITO layer and the Al layer, so that the ITO and the Al were prevented from being corroded. Finally, the effective display region and the electro-conductive members 6 were hermetically sealed by means of a seal box.

EXAMPLE 4

In this example, the electro-conductive members of the third embodiment of wire connection structure according to the invention were formed by an ink-jet method in a manner as described below. Referring to FIG. 8, the substrate 1 was made of glass and the third electrodes 2 were made of ITO, while the flexible printed wires 7 were made of Cu and the second electrodes 3 were AL—Li, Li electrodes.

Firstly, an ITO layer was formed on the entire surface of the glass substrate 1 by sputtering. Then, the second electrodes that had an intended profile were produced by etching the ITO layer and subjected to a surface treatment for 10 minutes by using UV rays. Thereafter, a hole injection layer was formed by physical evaporation of triphenylamine heximer (TPA-6: molecular weight 1,461, melting point 277° C., Tg 156° C.), which served as hole injection material. Then, a light emitting layer of 8-hydroxyquinoline metal complex, which might typically be tris-(8-quinolinole) aluminum (aluminum quinoline complex) and served as light emitting material, was formed also by physical evaporation. Thereafter, an electron injection layer was formed by physical evaporation of Al—Li, using a mask having through holes corresponding to the pattern of the second electrodes 3, and then Al electrodes were formed as second electrodes 3 by physical evaporation of Al. Subsequently, Ni complex was ejected from an ink-jet ejection apparatus onto an end of each of the second electrodes 3 and heated to 200° C. for drying to produce the electro-conductive members 6. Then, the flexible printed wires were combined with and bonded to the respective electro-conductive members 6. Thus, the sections electrically connecting the flexible printed wires 7 and the second electrodes 3 had three layers of Cu, Ni and Al so that the Cu and the Al were prevented from being corroded. Finally, the effective display region and the electro-conductive members 6 were hermetically sealed by means of a seal box.

EXAMPLE 5

In this example, the electro-conductive members of the third embodiment of wire connection structure according to the invention were formed by a gas deposition method in a manner as described below. Referring to FIG. 8, the substrate 1 was made of glass and the third electrodes 2 were made of ITO, while the flexible printed wires 7 were made of Cu and the second electrodes 3 were Al—Li, Al electrodes.

Firstly, an ITO layer was formed on the entire surface of the glass substrate 1 by sputtering. Then, the second electrodes 3 that had an intended profile were produced by etching the ITO layer. Thereafter, a hole injection layer was formed by physical evaporation of triphenylamine heximer (TPA-6: molecular weight 1,461, melting point 277° C., Tg 156° C.), which served as hole injection material. Then, a light emitting layer of 8-hydroxyquinoline metal complex, which might typically be tris-(8-quinolinole)aluminum (aluminum quinoline complex) and served as light emitting material, was formed also by physical evaporation. Thereafter, an electron injection layer was formed by physical evaporation of Al—Li, using a mask having through holes corresponding to the pattern of-the second electrodes 3, and then Al electrodes were formed as second electrodes 3 by physical evaporation of Al. Subsequently, Ni was formed onto an end of each of the second electrodes 3 by means of a gas deposition system to produce the electro-conductive members 6. Then, the flexible printed wires were combined with and bonded to the respective electro-conductive members 6. Thus, the sections electrically connecting the flexible printed wires 7 and the second electrodes 3 had three layers of Cu, Ni and Al so that the Cu and the Al were prevented from being corroded. Finally, the effective display region and the electro-conductive members 6 were hermetically sealed by means of a seal box.

EXAMPLE 6

In this example, the electro-conductive members of the fourth embodiment of wire connection structure according to the invention were formed by an ink-jet method in a manner as described below. Referring to FIG. 12, the substrate 1 was made of glass and the third electrodes 2 were made of ITO, while the flexible printed wires 7 were made of Cu and the second electrodes 3 were Al—Li, Al electrodes.

Firstly, an ITO layer was formed on the entire surface of the glass substrate 1 by sputtering. Then, the second electrodes 3 that had an intended profile were produced by etching the ITO layer. Thereafter, a hole injection layer was formed by coating triphenylamine heximer (TPA-6: molecular weight 1,461, melting point 277° C., Tg 156° C.), which served as hole injection material, by means of a spin coating method, heating it for drying and then removing the unnecessary parts by means of a laser. Then, a light emitting layer of 8-hydroxyquinoline metal complex, which might typically be tris-(8-quinolinole)aluminum (aluminum quinoline complex) and served as light emitting material, was formed by physical evaporation. Thereafter, an electron injection layer was formed by physical evaporation of Al—Li, using a mask having through holes corresponding to the pattern of the second electrodes 3, and then Al electrodes were formed by physical evaporation of Al. Subsequently, liquid containing Ni and showing controlled surface tension was ejected from an ink-jet ejection apparatus onto the gaps separating the flexible printed wires 7 and the corresponding second electrodes 3 and heated to 200° C. for drying to produce the electro-conductive members 6. Thus, the sections electrically connecting the lead-out electrodes 7 and the second electrodes 3 had a structure where the Ni layer was sandwiched between the Cu layer and the Al layer, so that the Cu and the Al were prevented from being corroded. Finally, the effective display region and the electro-conductive members 6 were hermetically sealed by means of a seal box.

Thus, as described above, an electro-conductive member directly contacts with an end of each first electrode to establish an excellent electric connection between the first electrode and the corresponding second electrode without using an insulating member.

What is claimed is:

1. A wire connection structure comprising a first, a second and a third electrode, and an electro-conductive member, said third electrode and said second electrode forming a light-emitting point, said second electrode being electrically connected to said first electrode and said first electrode functioning as a lead-out electrode by way of said electro-conductive member, said first electrode having at least top and front sides in electrical contact with said electro-conductive member at an end of said electro-conductive member.

2. The structure according to claim 1, wherein said first electrode is aligned substantially on a line with and separated from said second electrode and said electro-conductive member is disposed between them so that said first electrode and said second electrode are in electrical contact with each other via said electro-conductive member.

3. The structure according to claim 2, wherein said first electrode and said second electrode are separated by a gap having a width X and a height Y, the width X being smaller than the height Y.

4. The structure according to claim 2, wherein each of said first and second electrodes has at least top and front sides in electrical contact with said electro-conductive member at an end of said electro-conductive member.

5. The structure according to claim 1, wherein said first electrode further has a lateral side in electrical contact with said electro-conductive member at said end of said electro-conductive member.

6. The structure according to claim 1, wherein said first electrode is a flexible printed wire.

7. A display apparatus comprising a wire connection structure according to claim 1 arranged in an image display section thereof.

8. An electrophotography type image forming apparatus comprising a wire connection structure according to claim 1 arranged in a light source section thereof for irradiating a photosensitive member with light.

9. An illumination light source comprising a wire connection apparatus according to claim 1 arranged in a light source section thereof for irradiating light.

* * * * *

UNITED STATES PATENT AND TRADEMARK OFFICE
CERTIFICATE OF CORRECTION

PATENT NO. : 6,787,811 B2  Page 1 of 1
DATED : September 7, 2004
INVENTOR(S) : Yasuyuki Saito et al.

It is certified that error appears in the above-identified patent and that said Letters Patent is hereby corrected as shown below:

Column 14,
Line 65, "of-the" should read -- of the --.

Signed and Sealed this

Seventeenth Day of May, 2005

JON W. DUDAS
*Director of the United States Patent and Trademark Office*